United States Patent
Bradl et al.

(10) Patent No.: US 7,892,947 B2
(45) Date of Patent: Feb. 22, 2011

(54) METHOD FOR MACHINING A WORKPIECE ON A WORKPIECE SUPPORT

(75) Inventors: Stephen Bradl, Regensburg (DE); Walther Grommes, Furth/Oberhaching (DE); Werner Kröninger, Albersdorf (DE); Michael Melzl, Neutraubling (DE); Josef Schwaiger, Teugn (DE); Thilo Stache, Regensburg (DE)

(73) Assignee: Infineon Technologies AG, Munich (DE)

( * ) Notice: Subject to any disclaimer, the term of this patent is extended or adjusted under 35 U.S.C. 154(b) by 1015 days.

(21) Appl. No.: 11/580,707

(22) Filed: Oct. 13, 2006

(65) Prior Publication Data
US 2007/0117351 A1 May 24, 2007

Related U.S. Application Data

(63) Continuation-in-part of application No. PCT/EP2005/051493, filed on Apr. 1, 2005.

(30) Foreign Application Priority Data
Apr. 15, 2004 (DE) .................... 10 2004 018 249

(51) Int. Cl.
*H01L 21/30* (2006.01)
(52) U.S. Cl. .................. 438/459; 438/455; 438/456; 438/458; 438/977; 414/935; 414/936; 414/939; 414/941
(58) Field of Classification Search .............. 438/455, 438/456, 458, 459, 977; 414/935, 936, 939, 414/941
See application file for complete search history.

(56) References Cited

U.S. PATENT DOCUMENTS

| 4,023,609 A | 5/1977 | Rosenquist |
| 5,376,180 A | 12/1994 | Mahler |
| 6,342,434 B1 * | 1/2002 | Miyamoto et al. .......... 438/464 |
| 6,541,989 B1 | 4/2003 | Norris et al. |
| 7,115,485 B2 | 10/2006 | Priewasser |
| 7,195,988 B2 * | 3/2007 | Nemoto et al. ............ 438/459 |
| 7,335,578 B2 * | 2/2008 | Fukuoka et al. ............ 438/464 |
| 7,438,631 B2 | 10/2008 | Nagamoto et al. |
| 2002/0048907 A1 | 4/2002 | Miyamoto et al. |
| 2002/0115263 A1 | 8/2002 | Worth et al. |

(Continued)

FOREIGN PATENT DOCUMENTS
DE         100 54 038 A1     5/2002

(Continued)

OTHER PUBLICATIONS

Office Action in the China Patent Office, dated Aug. 28, 2009, for corresponding Chinese application No. 200810186369.0.

(Continued)

*Primary Examiner*—Kevin M Picardat
*Assistant Examiner*—Bac H Au
(74) *Attorney, Agent, or Firm*—Brinks Hofer Gilson & Lione

(57) ABSTRACT

A workpiece machining method includes attaching a workpiece to a workpiece support with the aid of joining means. The workpiece and the workpiece support are joined to one another by an annular joining means. The composite produced is machined. The machined workpiece is separated from the workpiece support.

24 Claims, 3 Drawing Sheets

U.S. PATENT DOCUMENTS

2004/0023609 A1    2/2004  Oshita et al.
2005/0221598 A1*  10/2005  Lu et al. .................... 438/613

FOREIGN PATENT DOCUMENTS

| DE | 103 01 245 A1 | 7/2004 |
|---|---|---|
| JP | 60172456 | 9/1985 |
| JP | 61-91936 | 5/1986 |
| JP | 3-296242 | 12/1991 |
| JP | 7-58041 | 3/1995 |
| JP | 8-250454 | 9/1996 |
| JP | 2002-298910 | 10/2002 |
| JP | 2002-2324835 | 11/2002 |
| JP | 2005123568 | 12/2005 |
| WO | WO 2004/032593 A2 | 4/2004 |

OTHER PUBLICATIONS

Unpublished Japanese priority document for U.S. 7,115,485, filed in Japan on Sep. 26, 2003, English translation provided.

* cited by examiner

METHOD FOR MACHINING A WORKPIECE ON A WORKPIECE SUPPORT

PRIORITY CLAIM

This application is a continuation-in-part of International Patent Application No. PCT/EP2005/051493, filed Apr. 1, 2005, which claims priority to German Patent Application No. DE 10 2004 018 249.3, filed Mar. 15, 2004, the contents of which are both incorporated by reference herein.

BACKGROUND

1. Technical Field

The invention relates to semiconductor material processing, and more particularly to machining a semiconductor workpiece on a workpiece support.

2. Background Information

Back side processes on thin wafers lead to problems in handling the wafers. In particular, thin wafers are wafers with a thickness of less than 300 mm. The handling problems become greater with increasing diameter of the wafers, i.e. particularly in the case of wafers having a diameter of between 100 mm and 300 mm or having a diameter of greater than 300 mm. In spite of an adaptation of machining plants to the machining of thin wafers and in spite of the associated expenditure, many handling disadvantages remain, particularly an additional operating effort, increased risk of fracture and restrictions in the processing.

To attach a workpiece to a workpiece support, an attaching means is used which is preferably arranged between the workpiece and the workpiece support in order to enable the workpiece to be machined in an unimpeded way and to ensure a joint also for workpieces at risk of fracture.

Japanese published document JP 04 188818 A discloses a semiconductor wafer which is bonded to a reinforcing material, such as to a polyamide film, for simple handling.

Although many types of support systems are conceivable for the wafer to be stable and manageable supported on a support, a large number of problems have to be solved at the same time. These problems include retaining a simple machining process, guaranteeing a high machining temperature, maintaining a simple detachment of the support without the risk of fracture for the wafer, and maintaining a relatively high stability in the process steps and during and after the detaching of the wafer from the support.

BRIEF SUMMARY

A method is disclosed for machining a workpiece which is attached to a workpiece support which, in particular, provides for simple separating and/or which, in particular, allows machining at temperatures up to 200° C. or even a temperature above 200° C.

The workpiece and the workpiece support may be joined to one another by an annular joining means. The workpiece may be separated from the workpiece support by removing parts of the workpiece and/or of the workpiece support in at least one separating area in addition to the method steps mentioned initially in the method according to the invention.

A semiconductor wafer, e.g. a so-called dummy wafer or a test wafer which is no longer needed, is also used as a workpiece support for a workpiece which is a semiconductor wafer. The support wafer can have any thickness. The width of a gap between the workpiece wafer and the support wafer is unimportant for carrying out the method so that no tolerances have to be maintained for this gap either.

In one embodiment—in which vacuum is used between workpiece and workpiece support—there is virtually no gap between workpiece and workpiece support. If both wafers consist, for example, of silicon, the coefficients of thermal expansion are also equal, which is particularly advantageous. Moreover, support wafers can be used which are a byproduct of semiconductor production and therefore do not add additional costs to the method.

In a preferred embodiment, the workpiece wafer is joined to the support wafer by a ring of a high-temperature-resistant substance, for example by 360° bonding. A suitable joining means is, for example, a joining means which consists of palladium or contains palladium. This annular joint can be located, for example, on the edge of the wafers, i.e. outside the active chip area. The joints are high-temperature-resistant and can be detached again, if required. In one embodiment, however, detaching the joints is not required because separating takes place around the joint or at the joint. If separating takes place at the joint, the joint is destroyed.

Due to the stabilizing joining of workpiece wafer and support wafer by means of annular bonding, the workpiece wafer can be machined further with commercially available installations, e.g. by means of an ion implanter, a CVD (chemical vapor deposition) installation, a sputtering installation, an illumination installation, in a lithography process or in a furnace process or in a thermal irradiation process, e.g. in a RTP (rapid thermal annealing) process. Due to the increased thickness and the resultant gain in stability of the composite comprising workpiece wafer and support wafer, there are no longer any handling problems.

The separating may be carried out along a separating area in which an annular joining means is located on a peripheral part of the workpiece and of the workpiece support, respectively. The actual joint remains undamaged. The separating may also be carried out along a separating area which, together with the edge of the workpiece or of the workpiece support, encloses an attachment part on which a joining means is attached. This embodiment is utilized, in particular, in the case of joining means which are arranged at the edge of the workpiece and of the workpiece support, respectively. In this case, too, the actual joint remains undamaged since separating takes place around it. In a further alternative embodiment, the separating area contains a boundary face between the workpiece or the workpiece support, on the one hand, and a joining means on the other hand. The boundary face and thus also a part of the joint or the entire joint is destroyed during the separating, as a result of which the joint is detached.

The workpiece and the workpiece support may have the same contours. Due to this measure, machining installations for certain workpiece thicknesses can also be used if the workpieces are thinner. No rebuilding is required because the thickness and the contour of the composite of workpiece and workpiece support correspond to the thickness and the contour of an unthinned workpiece.

In a preferred embodiment, workpiece and workpiece support, respectively, are round disks, particularly semiconductor wafers with a so-called flat or a notch for identifying a crystal orientation.

If the workpiece support and the workpiece consist of the same material or the same material composition, thermal processes can be carried out without additional stresses due to the joint or due to the composite arrangement with the workpiece support. If the workpiece consists of a semiconductor material, a method for machining semiconductor material is carried out during the machining, particularly a lithography method, a metallization method, a layer application method, a layer patterning method, an implantation method, a furnace process or a thermal irradiation process.

The methods for machining may be carried out on the back side of the workpiece, i.e. on a side which does not contain any active components such as e.g. transistors.

The separating may be carried out by sawing, milling, grinding or machining with lasers. These methods are suitable, in particular, in the case of workpieces or workpiece supports made of glass, ceramic or of semiconductor materials. In one embodiment, a straight separating cut is created parallel to the plane of the wafers as is produced, for example, when using a straight saw blade or a circular saw blade. However, in deviation from this solution, perforated circular saw blades can also be used for separating the workpiece from the workpiece support.

The workpiece may be attached to a holding means during the removal. In one embodiment, a so-called gel pack gripper is suitable. In another embodiment, only parts of the workpiece support but not of the workpiece are removed during the separating. This can be achieved, for example, if the separating tool only penetrates into a gap between the workpiece and the workpiece support.

In another embodiment, the separating tool only penetrates into a part of the workpiece support. Complete separation of workpiece and workpiece support is achieved by the vibration occurring during the separating. In this case, possibly no gap at all is used between the workpiece and the workpiece support.

The workpiece and the workpiece support may be bonded to one another, the adhesive joint being temperature-resistant up to 200° C. or up to 400° C. or up to 800° C. or even up to 1200° C. In spite of this high temperature resistance, it is possible to separate at low temperatures due to the separating methods explained above.

A conductive adhesive may be used which, for example, is built up on a silver basis. Such conductive adhesives are known, for example, for heaters on car windows. The temperature resistance of the adhesive is increased if palladium is added or if the adhesive is completely built up on a palladium basis. The temperature resistance increases as the proportion of palladium increases.

A method is disclosed with the method steps mentioned initially, in which at least one attaching means is arranged between the workpiece and the workpiece support. The attaching means is thermally stable for temperatures up to 200° C. (degrees Celsius) or up to 400° C. or up to 800° C. or even up to 1200° C. During the machining of the workpiece, a high-temperature process is carried out in which the temperature, in the order of the aforementioned temperatures, is, for example, greater than 150° C., greater than 350° C., greater than 700° C. or greater than 1000° C. The separating of workpiece and workpiece support, however, is carried out at a temperature which is below the machining temperature.

A conductive adhesive having the characteristics explained above, particularly a conductive adhesive based on palladium, may be used as attaching means.

The workpiece and the workpiece support, respectively, are formed in the method according to the second aspect and in the method according to the first aspect.

Other systems, methods, features and advantages of the invention will be, or will become, apparent to one with skill in the art upon examination of the following figures and detailed description. It is intended that all such additional systems, methods, features and advantages be included within this description, be within the scope of the invention, and be protected by the following claims.

BRIEF DESCRIPTION OF THE DRAWINGS

The invention can be better understood with reference to the following drawings and description. The components in the figures are not necessarily to scale, emphasis instead being placed upon illustrating the principles of the invention. Moreover, in the figures, like referenced numerals designate corresponding parts throughout the different views.

DETAILED DESCRIPTION

Figure 1:
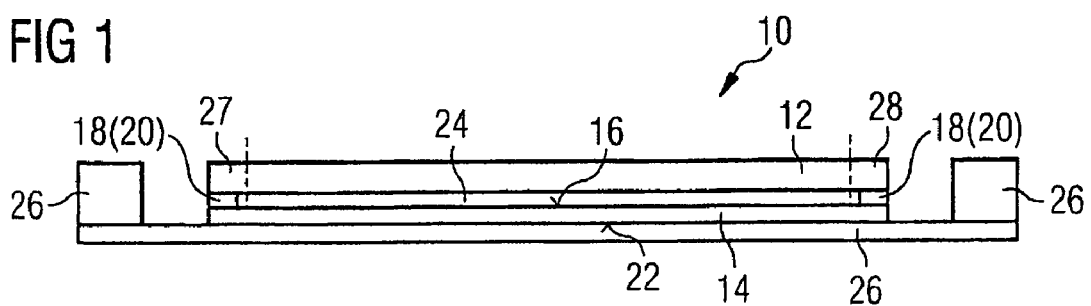
FIG. 1 shows a composite of support wafer and workpiece wafer on a separating device.

FIG. 1 shows a composite 10 of a support wafer 12 and a workpiece wafer 14 to be machined. The workpiece wafer 14 has a front 16 on which a multiplicity of integrated circuits has been created, e.g. CMOS (complementary metal oxide semiconductor) circuits. The front 16 faces the support wafer 12 and is attached to the support wafer 12 with the aid of a ring 18 of conductive adhesive 20, e.g. based on palladium. After support wafer 12 and workpiece wafer 14 have been bonded, the workpiece wafer 14 has been thinned on its back side 22, for example with the aid of a grinding installation, by more than 100 mm. After the thinning, the back side 22 was provided, for example, with back side contacting. During this process, a thermal process with a machining temperature of greater than 350° C. or even greater than 450° C. is carried out. Following this, the back side 22 was attached to a sawing frame 26.

After the composite 10 has been attached to the sawing frame 26, the support wafer 12 is first removed from the thinned workpiece wafer 14 by removing the support wafer 12 at the circumference by means of a sawing cut, see cross-hatched areas 27 and 28. Due to the sawing cut, the support wafer 12 is sawn off at its circumference to such an extent that the joint to the workpiece wafer 14 is removed. This can be carried out by the saw or a milling cutter or by grinding or by a laser.

After the support wafer 12 has been removed from the workpiece wafer 14, the integrated circuits on the workpiece wafer 14 are cut apart with the aid of known sawing methods, tested and provided with a package.

Figure 2:
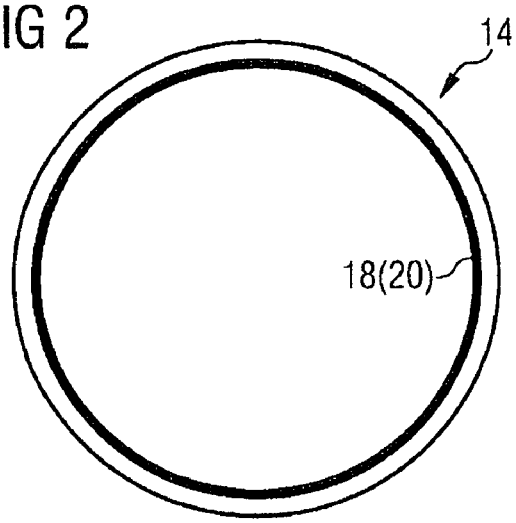
FIG. 2 shows a bottom view of a workpiece wafer.

FIG. 2 shows a bottom view of a workpiece wafer 14 on which a ring 18 of adhesive 20 is applied.

Figure 3:
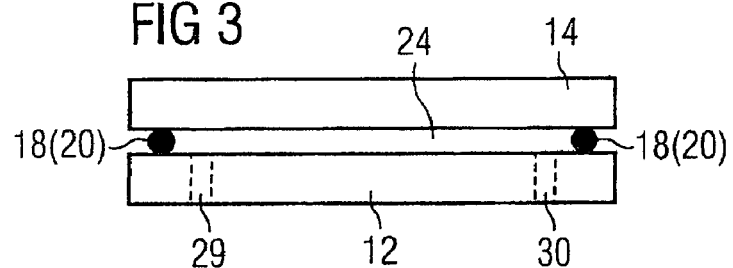
FIG. 3 shows a workpiece wafer and a workpiece support wafer before they are joined to form a composite.
Figure 4:
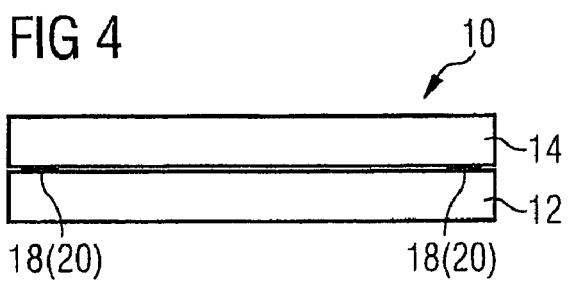
FIG. 4 shows a composite of workpiece wafer and workpiece support wafer.

FIG. 3 shows a support wafer 12 and a workpiece wafer 14. Between the support wafer 12 and the workpiece wafer 14, a ring 18 of adhesive 20 is arranged which is intended to lead to an adhesive joint between these elements. The two support wafers 12 and workpiece wafers 14 are joined to one another in parallel by method steps such as pressing together and vulcanizing out and the ring 18 of adhesive 20 is pressed together to a thickness of only 2 mm, which can be seen from FIG. 4. To optimize the joining process, the intermediate space 24 between the workpiece wafer 14 and the support wafer 12 is evacuated. For this purpose, small holes 29 and 30 are provided in the support wafer 12 through which the existing atmosphere can be pumped away. These holes 29 and 30 are sealed or covered during the further processing. A variant which can be implemented by the ring 18 of adhesive not being closed completely is not shown in the drawing. In this embodiment, the ring 18 must then be closed completely after the evacuation.

A possibility for evacuating the intermediate space 24 which is not shown but is advantageous consists in joining the workpiece wafer 14 and the support wafer 12 in a chamber and evacuating this chamber.

Figure 5:
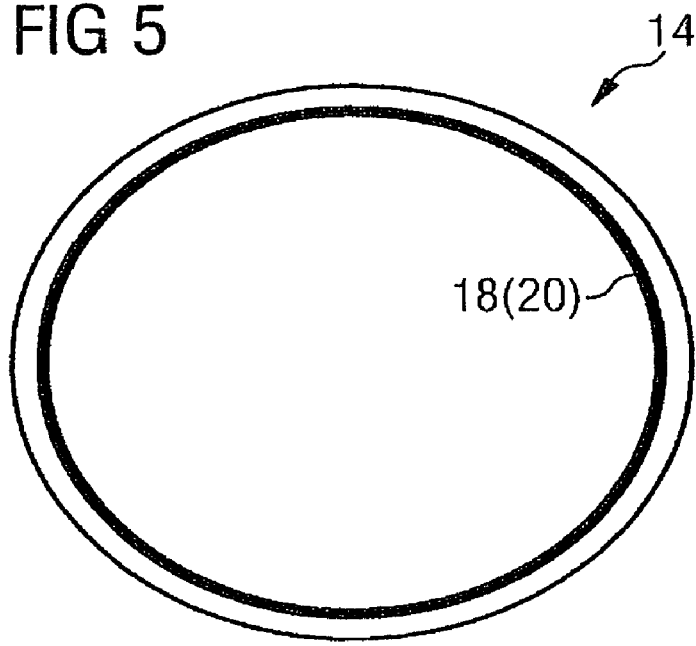
FIG. 5 shows a further bottom view of a workpiece wafer.
Figure 6:
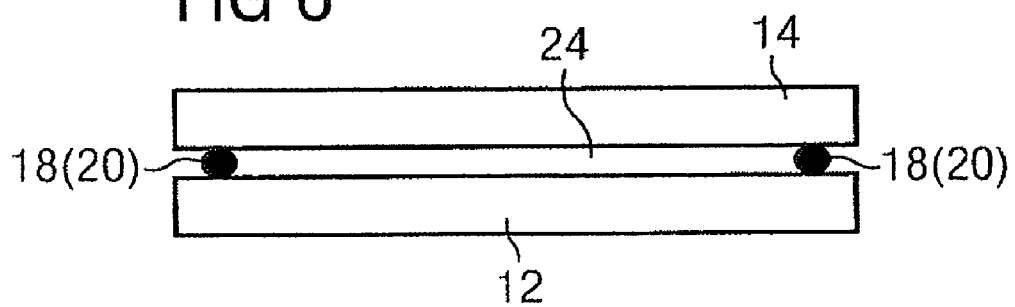
FIG. 6 shows a workpiece wafer and a workpiece support wafer before they are joined to form a composite.

FIG. 5 again shows the bottom view of the workpiece wafer 14 with the ring 18 of adhesive 20. FIG. 6 repeats the representation of FIG. 3 but does not show the holes 29 and 30. From the state shown here, the evacuation, the pressing together and the vulcanizing-out is carried out—as already described—so that a composite 10 of workpiece wafer 14 and support wafer 12 is again produced.

Figure 7:
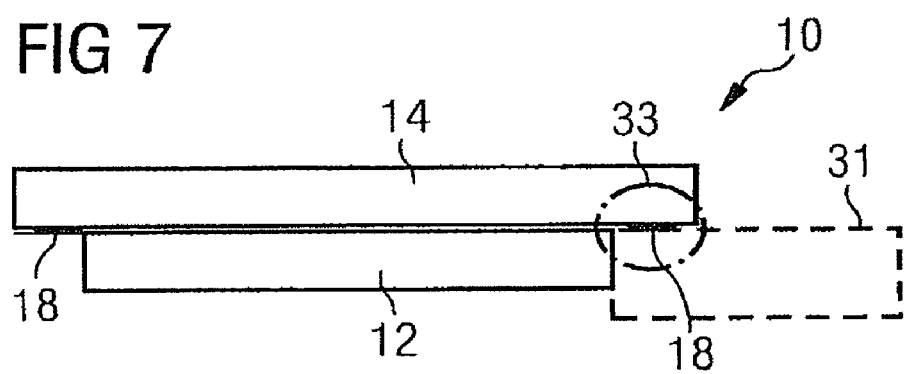
FIG. 7 shows a composite of workpiece wafer and workpiece support wafer after a separating process.

FIG. 7 shows how a tool, for example a saw 31, a milling tool or a grinding disk, radially engages the circumference of the support wafer 12 for separating this composite and removes a part area of the support wafer 12 as has already been shown with the areas 27 and 28 in FIG. 1. During this process, the removal of the areas 27 and 28 can be controlled dimensionally in such a manner that the ring 18 of hardened adhesive 20 remains on the workpiece wafer 14 and stabilizes it. The surface of the ring 20 of adhesive 20 can then represent a boundary face which is produced during the separation by the separating tool 31.

Figure 8:
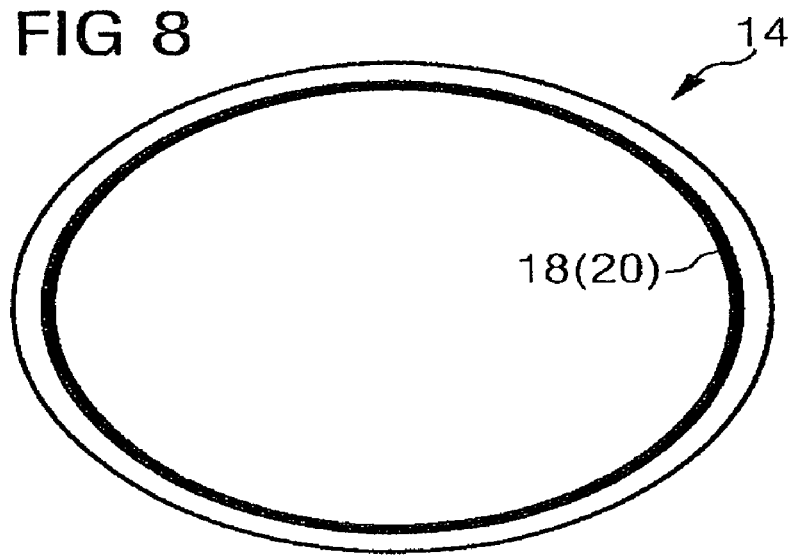
FIG. 8 shows a further bottom view of a workpiece wafer.

FIG. 8 again shows a bottom view of a workpiece wafer 14 with a closed ring 18 of adhesive 20 before the joining to form a composite.

Figure 9:
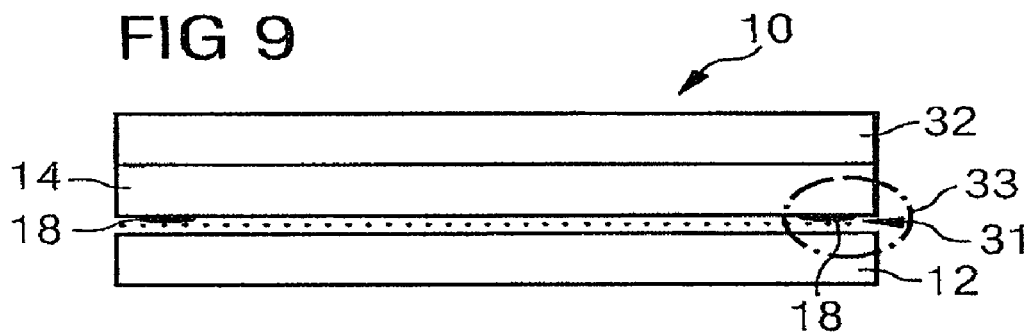
FIG. 9 shows a composite of workpiece wafer, workpiece support wafer and a gripper.
Figure 10:
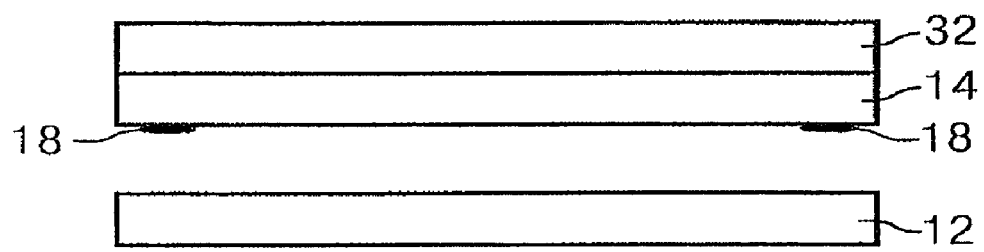
FIG. 10 shows a separated composite with gripper.

FIG. 9 shows an auxiliary device in the form of a so-called "gel pack gripper" 32 for separating the composite 10. This type of gripper 32 is known and is successfully used in practice in the separation of planar substrates when these cannot be easily separated from one another without an auxiliary device due to strong adhesive forces even though they are no longer mechanically joined to one another. The gel pack gripper 32 holds the workpiece wafer 14 and a separating tool, for example a saw 31, saws the ring 18 of adhesive 20 radially so that the mechanical joint between workpiece wafer 14 and support wafer 12 is separated. However, the strong adhesive forces still prevent the composite 10 of these two elements 12 and 14 from separating and workpiece wafer 14 and support wafer 12 can only be separated by using the gel pack gripper 32 as is shown in a simplified manner in FIG. 10.

Figure 11:
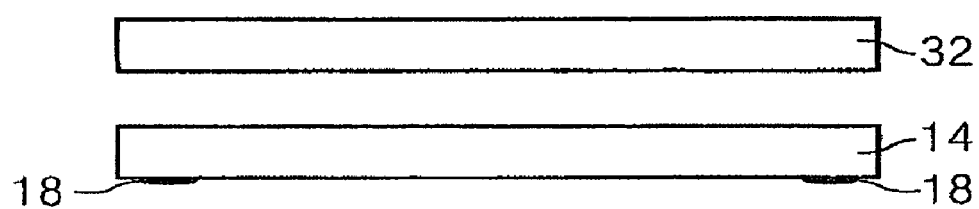
FIG. 11 shows a workpiece wafer and a detached gripper.

FIG. 11 shows diagrammatically that the gel pack gripper 32 is then separated from the workpiece wafer 14.

As is also shown in the exemplary embodiment described last, a stabilizing ring 18 can remain on the surface of the workpiece wafer 14 if this is required by the further method steps. In this context, it is of no importance whether the stabilizing ring 18 remains on the front 16 or on the back side 22.

The methods are suitable for applying workpieces, particularly semiconductor wafers, on workpiece supports, particularly support wafers, and for separating them again so that the workpiece wafers can be machined better, wherein processes such as grinding, sputtering, wet chemistry (SEZ etching; Marangonie dryer, etc.), spin etching, cleaning, implantation, PVD and others are suitable.

It is therefore intended that the foregoing detailed description be regarded as illustrative rather than limiting, and that it be understood that it is the following claims, including all equivalents, that are intended to define the spirit and scope of this invention.

The invention claimed is:

1. A method for machining a workpiece on a workpiece support, the method comprising:
   attaching a workpiece to a workpiece support;
   machining the workpiece attached to the workpiece support; and
   separating the machined workpiece from the workpiece support,
   wherein the workpiece and the workpiece support are joined to one another by an annular joining means and the workpiece and the workpiece support are joined to one another at an annular area, and the workpiece and the workpiece support are separated by an annular separating cut.

2. The method of claim 1, wherein the separating is carried out along a separating area which comprises an attachment area on which the annular joining means for joining the workpiece and the workpiece support is present.

3. The method of claim 1, wherein the workpiece and the workpiece support have identical contours, and/or wherein the workpiece or the workpiece support are angular plates or round disks, and/or wherein the workpiece and the workpiece support comprise a same material, and/or wherein the workpiece comprises a semiconductor material, and/or wherein the workpiece support comprises a semiconductor material.

4. The method of claim 3, wherein the round disks are flattened at a circumferential side.

5. The method of claim 3, wherein a thermal irradiation process is carried out on a back side of the workpiece.

6. The method of claim 1, wherein the separating comprises laser processing, sawing, milling or grinding.

7. The method of claim 1, wherein the annular separating cut is parallel to a plane of the workpiece and of the workpiece support.

8. The method of claim 1, wherein the annular separating cut is perpendicular to a plane of the workpiece and of the workpiece support.

9. The method of claim 1, wherein during the separating, only parts of the workpiece support but not of the workpiece are cut.

10. The method of claim 1, wherein a complete separation of the workpiece support is achieved by vibration occurring during the separating.

11. The method of claim 1, wherein the annular joining means is an adhesive.

12. The method of claim 11, wherein the adhesive is a conductive adhesive based on silver or based on palladium.

13. The method of claim 1, wherein the separating is carried out along a separating area which, together with an edge of the workpiece or of the workpiece support, encloses an attachment area on which the annular joining means is attached.

14. The method of claim 1, wherein the separating is carried out along a separating area that includes a boundary face between a) the workpiece and the annular joining means or b) the workpiece support and the annular joining means.

15. The method of claim 1, wherein the machining includes a lithography process and/or a metallization process and/or a layer application process and/or a layer patterning process and/or an implantation process and/or a furnace process and/or a thermal irradiation process.

16. The method of claim 1, wherein the machining includes a grinding process.

17. A method for machining a workpiece on a workpiece support, the method
comprising:
attaching a workpiece to a workpiece support using a conductive adhesive for at least one attachment, wherein the conductive adhesive comprises a conductive adhesive based on silver or based on palladium;
machining the workpiece attached to the workpiece support; and separating the machined workpiece from the workpiece support,
wherein the at least one attachment is arranged between the workpiece and the workpiece support, the at least one attachment being thermally stable for temperatures up to at least 200° C., the workpiece is machined at a machining temperature of at least 150° C., and the workpiece and the workpiece support are detached from one another at a temperature which is below the machining temperature.

18. A method for machining a workpiece on a workpiece support, the method comprising:
attaching a workpiece to a workpiece support;
machining the workpiece attached to the workpiece support; and
separating the machined workpiece from the workpiece support,
wherein the workpiece and the workpiece support are joined to one another at an annular area, and the workpiece and the workpiece support are separated by an annular separating cut.

19. The method of 18, wherein at least part of a joint disposed between the workpiece and the workpiece support, formed at the annular area, remains on the workpiece after the workpiece and the workpiece support are separated.

20. The method of claim 19, wherein separation takes place around the joint.

21. The method of claim 18, wherein a part of the workpiece support remains attached to the workpiece after the workpiece and the workpiece support are separated.

22. The method of claim 18, wherein the separating cut is carried out along a separating area which, together with an edge of the workpiece support, encloses the annular area.

23. The method of claim 18, wherein the workpiece and workpiece support are joined to one another by an adhesive.

24. The method of claim 18, wherein the machining comprises a grinding process.

* * * * *